United States Patent [19]

Dorsey et al.

[11] Patent Number: 4,774,126

[45] Date of Patent: Sep. 27, 1988

[54] SOLDERABLE THERMOPLASTIC STRUCTURE

[75] Inventors: Denis P. Dorsey, Bucks County, Pa.; Stephen Rizkowski, Middlesex County, N.J.

[73] Assignee: General Electric Company, Schenectady, N.Y.

[21] Appl. No.: 75,486

[22] Filed: Jul. 20, 1987

[51] Int. Cl.$^4$ .................... B32B 3/00; B32B 3/10
[52] U.S. Cl. .................... 428/209; 428/138; 428/339; 428/901
[58] Field of Search .............. 428/209, 138, 339, 901; 228/121

[56] References Cited

U.S. PATENT DOCUMENTS 4,495,253  1/1985  Abel ........................ 428/419
4,499,157  2/1985  Mulliner et al. ............ 428/457
4,591,088 11/1986  Mulliner et al. ............ 228/121
4,623,577 11/1986  Hsive et al. ............... 428/209

Primary Examiner—John E. Kittle
Assistant Examiner—P. J. Ryan
Attorney, Agent, or Firm—William Squire; James C. Davis; Paul R. Webb, II

[57] ABSTRACT

A low cost thermoplastic material having a low heat distortion (HDT) thermoplastic material forms the main structural component of a structural member. A relatively high cost high HDT thermoplastic material is attached to the low cost main structural component and is plated with a solderable metallic coating. The coating can be attached to other structures with relatively higher temperature molten solder with negligible distortion. The structural member may be, for example, an electrical shield to be soldered to a printed circuit board or a printed circuit board whose core is low HDT material and exterior is high HDT material.

11 Claims, 2 Drawing Sheets

SOLDERABLE THERMOPLASTIC STRUCTURE

This invention relates to solderable thermoplastic structures which tend to resist distortion in the presence of soldering heat.

Printed circuit board substrates presently may be made of thermoplastic materials to which are attached conductors and components which form an electric circuit. Frequently, the electrical components are attached to the conductors by soldering. A typical system for soldering such components passes the circuit board and leads through a standing wave of molton solder which is usually above 400° F. (about 225° C.). Because the wave contacts the board its heat can distort the board. Therefore, the board needs to be fabricated from relatively costly heat resistant materials.

Most inexpensive thermoplastic materials such as acrylbutidyne styrene (ABS) or polycarbonate mixtures have a heat distortion temperature (HDT) as measured by the American Society For Testing Materials (ASTM) of around 200° F. and more particularly 197° F. for polystyrene and 220° F. for polycarbonate. ABS materials, therefore, tend to soften and distort in the presence of soldering temperatures induced by a solder wave.

To preclude such distortion more costly thermoplastic materials known as engineering plastics may be employed in printed circuit board applications. These materials have an HDT of about 408° F. or higher. However, these materials tend to be relatively costly compared to the low temperature ABS materials. In high volume production, a difference in cost between the two materials can be significant. The present inventors, therefore, recognize a need for a solderable low cost thermoplastic structure, particularly a structure which may be used in printed circuit board applications.

According to the present invention a solderable thermoplastic structure comprises a first thermoplastic member made of material which tends to soften in response to a first temperature below about 125° C. A second thermoplastic member is molded to and secured to the first member and which tends to soften at a second temperature of about 225° C. and higher. A metallic coating is on at least a portion of the second member and is adapted to be soldered. When the second thermoplastic member is soldered to an additional structure the heat from the soldering process tends to have negligible effect on the structural integrity of the second member.

Figure 1:
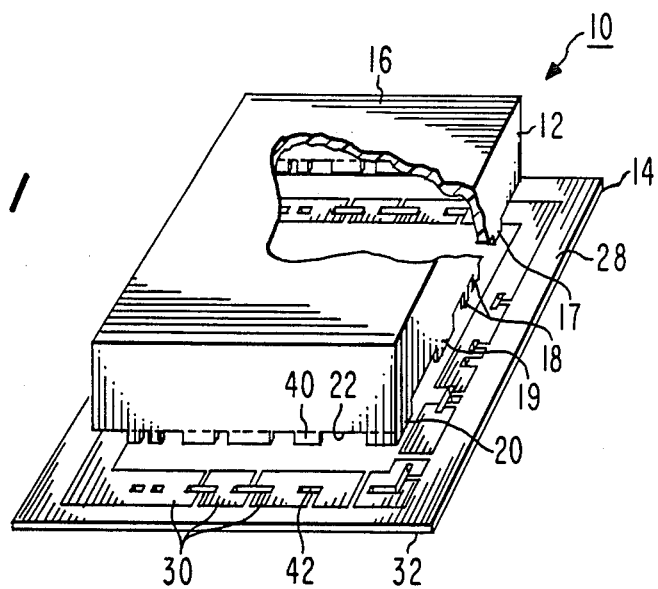
FIG. 1 is an exploded isometric view of a solderable thermoplastic structure in accordance with one embodiment of the present invention.

In FIG. 1 assembly 10 comprises an electrical shield 12 and a printed circuit board 14 to which the shield 12 is to be secured. Shield 12 comprises a molded thermoplastic rectangular box-like structure having a box-like frame 16 to which are attached a plurality of tabs 17–20, and so forth. The frame 16 is formed of low cost low temperature thermoplastic material such as acrylbutidyne styrene (ABS) or more commonly referred to as polystyrene having an HDT of 197° F. or polycarbonate having an HDT of about 220° F. (about 125° C.). These materials soften at a temperature of above their HDT and, therefore, tend to distort and soften when passed through a molton solder bath. Other materials may also be used for forming the frame 16. Frame 16 is formed by injection molding or other molding processes. Frame 16 has an edge 22 to which the tabs 17–20 are secured.

Figure 3:
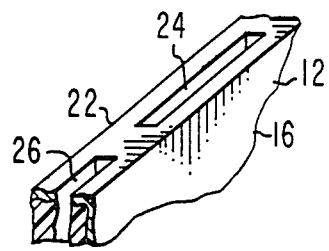
FIG. 3 is an isometric view of a portion of the structure of FIG. 1 prior to assembly.

In FIG. 3, edge 22 has a plurality of slots 24, 26 and so forth molded therein for receiving respective different tabs. Tabs 17–20 are made with an engineering plastic have an HDT of about 408° F. or higher. For example, one high temperature thermoplastic material forming the tabs 17 through 20 may be polyethersulfone having an HDT of about 408° F. It is sold by the ICI Company under the trade name Victrex. A second material having a high HDT, for example, 500° F., is polythenylene sulfide (PTS). A third material having an HDT of 408° F. is polyetherimide which is made available by General Electric Company under the trade name of Ultem. These high temperature thermoplastics are just an example of the kinds of materials that can be used to form the tabs 17–20. Tabs 17–20 are molded in situ in the slots 24, 26 and so on, FIG. 3, of Frame 16 in a single injection molding process operation. In the alternative, the tabs may be molded separately and then attached to the frame 16 at designated locations.

In FIG. 1, printed circuit board 14 comprises a substrate, which may be thermoplastic or of more widely used epoxy-glass material, to which are attached conductors (not shown) and electrically conductive ground conductors 30. The underside of the substrate 28 may include a conductive ground plane 32. Conductors 30 make electrically conductive contact with conductive shield 12 which is formed by electroplating a metallic coating on the exterior of frame 16 including edge 22 and the tabs 17–20. Shield 12 is electroplated over the entire exterior of frame 16 or, in the alternative, over the frame interior surface including the tabs. Shield 12 edge 22 makes electrical conductive contact with the conductors 30 when the frame 16 is attached to the printed circuit board 14. The tabs, such as tab 40, pass through the mating slots, e.g., slot 42, in the printed circuit board substrate 28 and project beyond the printed circuit board 14 conductor 32.

Figure 4:
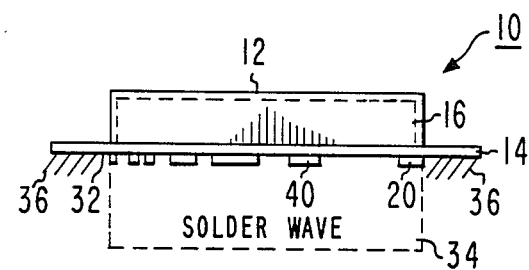
FIG. 4 is an end elevation view of the structure of the embodiment of FIG. 1 passing through a solder wave.

In FIG. 4, the frame 16 and printed circuit board 14 assembly are passed through a solder wave 34 by means of a conventional conveyer represented by symbols 36. The tabs, such as tab 40, of the frame 16 and the conductor 32 pass through the solder wave. The conductive coating on the tabs projects beyond conductor 32 of the printed circuit board 14. When the assembly 10 is passed through the solder wave 34 the solder solders the tabs to the ground conductor 32 soldering the tabs and thus the shield 12 to the board 14.

Figure 2:
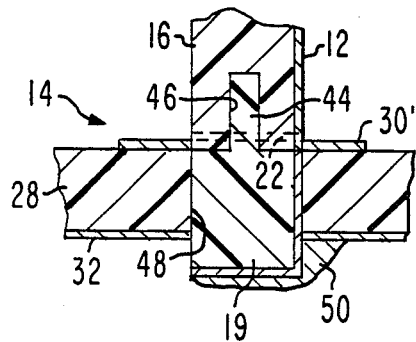
FIG. 2 is a sectional elevation view of a portion of the structure of FIG. 1 when assembled.

In FIG. 2, a typical tab 19 has a tongue of 34 formed when the tab 19 is molded to and in the slot 46 of frame 16. Tab 19 passes through slot 48 in the printed circuit board substrate 28. The conductive coating at edge 22 abuts conductor 30' on printed circuit board 14 making electrical contact therewith. Solder fillet 50 couples the shield 12 with ground plane conductor 32.

In producing the solder 50 fillet shield 12 and tab 19 are exposed to the elevated temperature of the molten solder and the resultant high temperature thereof. However, because the tab 19 is made of a relatively high temperature thermoplastic it does not significantly soften or distort or otherwise change dimension in a response to the brief exposure to the solder heat, which is momentary. Also, the thermoplastic material forming the tabs are of relatively low thermal conductivity. This minimizes conducting heat to the low temperature frame 16. The tabs once cooled are not normally thereafter exposed to molten solder unless the frame 16 needs to be disassembled from the printed circuit board 14. However, such disassembly is normally rare. The shielding effect of the shield 12 is excellent because it has a metallic coating which is nonporous and provides a relatively electrical impervious shield to the printed circuit board circuitry contained within the hollow of the frame 16 within the patterns of conductors 30.

Figure 5:
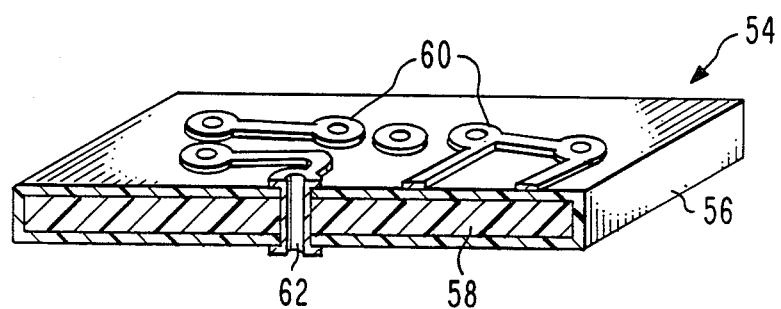
FIG. 5 is a sectional isometric view of a printed circuit board in accordance with a second embodiment of the present invention.

It is apparent that it is relatively costly to make the entire printed circuit board 14 with high temperature thermoplastic material similar to that provided the tabs. In FIG. 5, a printed circuit board 54 can be exposed to the solder wave 34 of FIG. 4 with a minimum of distortion and softening of the structure thereof in response to the molten solder high temperatures. Board 54 comprises an outer shell 56 and an inner core 58. Inner core 58 is made of relatively low temperature inexpensive ABS thermoplastic material. The outer shell 56 which is injection molded over the inner core 58 comprises the relatively high temperature engineering thermoplastics such as Ultem, Victrex and PTS. The outer shell 56 has a thickness sufficient to absorb most of the heat generated when the circuit board is momentarily passed through the solder wave. The solder wave thus impinges upon the outer shell 56 and the high solder temperature does not reach the inner core 58 due to the barrier provided by the outer shell. Conductor pattern 60 is formed on one or more of the surfaces of the outer shell 56. Through holes are also formed through the composite structure to accept component leads. Through hole 62, by way of example, is plated to permit soldering of a component lead thereto. The heat absorbed in region of the core 58 in hole 62 exposed to the high temperature solder material during soldering of the leads is relatively negligible due to the short time period and the small amount of solder involved.

Figure 6:
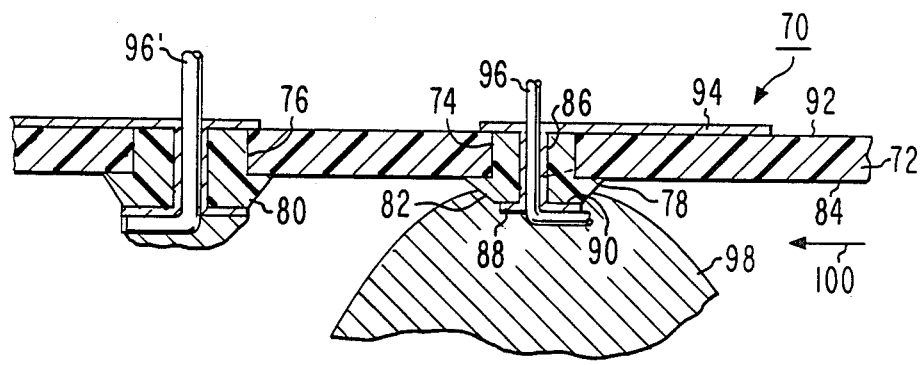
FIG. 6 is a sectional elevation view through a printed circuit board in accordance with a third embodiment of the present invention.

In the alternative, a second printed circuit board 70, FIG. 6, comprises a substrate 72 formed of low cost thermoplastic material such as polystyerine and polycarbonate. Substrate 72 is formed with a plurality of apertures of which apertures 74 and 76 are representative. Mating high temperature injection molded thermoplastic inserts, for example, representative inserts 78 and 80, are formed in the respective apertures 74 and 76. The inserts 78 and 80 and others (not shown) are molded "in situ" to the printed circuit board substrate 72.

Representative insert 78 is a circular cylindrical plug having a conical frustrum head 82 which projects beyond printed circuit board surface 84. Head 82 projects beyond surface 84 a small fraction of an inch, for example, an eighth of an inch. Insert 78 has a central axially extending aperture 86 to which conductor 88 is plated. The conductive material forming conductor 88 is also plated on the surface 90 of insert 78 head 82 and on surface 92 of the substrate 72 to form a printed circuit conductor 94. A component lead 96 passes through the plated aperture 86 and is bent over in a conventional manner. The assembly is later passed through a solder wave 98 to solder the lead 96 to the conductor 88 as illustrated by the previously soldered lead 96' at head 80.

Because the insert 78 is above the surface 84 of the printed circuit board, when the printed circuit board is passed over the solder wave 98 in direction 100, most of the solder wave impinges upon the insert 78 and negligible amounts of the solder wave impinges upon the substrate 72. Thus, the heat of the high temperature of the wave 98 is transferred mostly to insert 78 without significant effect on substrate 72. In this way relatively low cost, low temperature thermoplastic materials may be used to form the substrate 72 and the high temperatures thermoplastics forming the inserts 78 and 80 serve to immunize the circuit board assembly from the distortion and softening effects of the heat of the solder wave 98.

While several structures are disclosed herein as representative of a solderable thermoplastic configuration it should be understood that these are examples and not limitations. Other solderable structures may be made from the combination of low temperature and high temperature thermoplastics as described herein.

What is claimed is:

1. A solderable thermoplastic structure comprising:
   a first thermoplastic member made of material which softens in response to a first temperature below about 125° C.;
   a second thermoplastic member secured to the first member and which softens at a second temperature above about 225° C.; and
   a first solderable metallic coating on at least a portion of the second member.

2. The structure of claim 1 further including a third member soldered to said second member metallic coating.

3. The structure of claim 2 wherein said first and third members form an enclosed electrically shielded space.

4. The structure of claim 2 wherein the third member is a printed circuit board having a broad surface and a conductive layer on that surface, and said first member has a hollow core and includes an electrically conductive coating thereon for electrically shielding said core, said printed circuit board layer and first member being connected to form said core into an enclosed electrically shielded space.

5. The structure of claim 1 wherein said second member is molded "in situ" to the first member.

6. The structure of claim 1 wherein said first member is a planar sheet substrate printed circuit board having a plurality of coplanar conductors on a broad surface thereof lying in a first plane, at least one of said second members being secured to the substrate and having a surface thereof lying in a second plane spaced from the first plane, at least one of said conductors having a portion thereof lying in said second plane.

7. The structure of claim 6 wherein said substrate has a plurality of apertures therein, each aperture being in communication with a conductor, a plurality of said second members, each second member being secured to the substrate at a different aperture, each said second members having an aperture, the conductor corresponding to a given second member passing through said given second member aperture, said second plane facing and spaced from a broad surface of the substrate opposite the first plane surface.

8. A solderable thermoplastic structure comprising:

a planar thermoplastic sheet substrate comprising a thermoplastic material which has a heat distortion temperature (HDT) of below about 125° C.;

a first electrical conductor secured to a first broad surface of said substrate;

at least one aperture through said substrate, said aperture corresponding to and in communication with said conductor;

an apertured thermoplastic member formed of a thermoplastic material which has a HDT of at least about 225° C. secured to said substrate in said at least one aperture and extending beyond a second broad surface of the substrate opposite the first broad surface, said member having a planar surface spaced from and lying in plane facing said second broad surface; and a second electrical conductor on said member planar surface passing through said member aperture in electrically conductive engagement with the first electrical conductor.

9. The structure of claim 8 including an electrical component lead passing through said member aperture and soldered to said second electrical conductor.

10. A solderable thermoplastic structure comprising:

a first thermoplastic sheet member having a heat distortion temperature (HDT) of below about 125° C.;

a layer of a second thermoplastic material having a (HDT) of at least about 225° over the first member; and a electrically conductive printed circuit pattern on at least one surface of said layer.

11. The structure of claim 10 wherein said pattern is on both sides of said sheet member, portions of said pattern on each said sides extending through said sheet member and layer to electrically couple portions of the pattern on each sheet member side.

* * * * *